US007886434B1

(12) United States Patent
Forman

(10) Patent No.: US 7,886,434 B1

(45) Date of Patent: Feb. 15, 2011

(54) METHOD FOR MAKING A MICROMACHINED MICROWAVE SIGNAL CONTROL DEVICE

(75) Inventor: Michael A. Forman, Mountain House, CA (US)

(73) Assignee: Sandia Corporation, Livermore, CA (US)

( * ) Notice: Subject to any disclaimer, the term of this patent is extended or adjusted under 35 U.S.C. 154(b) by 367 days.

(21) Appl. No.: 12/136,890

(22) Filed: Jun. 11, 2008

Related U.S. Application Data

(62) Division of application No. 11/149,400, filed on Jun. 8, 2005, now Pat. No. 7,420,442.

(51) Int. Cl.
*H05K 3/02* (2006.01)
*H01P 3/08* (2006.01)

(52) U.S. Cl. ............................ 29/846; 29/830; 29/831; 29/832; 29/837; 29/854; 333/205

(58) Field of Classification Search .................. 29/600, 29/846, 830, 831, 832, 837, 854; 333/205, 333/202, 204, 208; 343/700 MS; 430/321, 430/290

See application file for complete search history.

(56) References Cited

U.S. PATENT DOCUMENTS

| | | | | |
|---|---|---|---|---|
| 5,168,542 | A * | 12/1992 | Chakravorty et al. | 385/132 |
| 5,453,154 | A * | 9/1995 | Thomas et al. | 216/18 |
| 6,169,518 | B1 * | 1/2001 | Nelson et al. | 342/373 |
| 6,403,396 | B1 * | 6/2002 | Gudesen et al. | 438/99 |
| 6,649,413 | B1 * | 11/2003 | Schultz et al. | 506/11 |

* cited by examiner

*Primary Examiner*—Derris H Banks
*Assistant Examiner*—Tai Nguyen
(74) *Attorney, Agent, or Firm*—Timothy P. Evans

(57) ABSTRACT

A method for fabricating a signal controller, e.g., a filter or a switch, for a coplanar waveguide during the LIGA fabrication process of the waveguide. Both patterns for the waveguide and patterns for the signal controllers are created on a mask. Radiation travels through the mask and reaches a photoresist layer on a substrate. The irradiated portions are removed and channels are formed on the substrate. A metal is filled into the channels to form the conductors of the waveguide and the signal controllers. Micromachined quasi-lumped elements are used alone or together as filters. The switch includes a comb drive, a spring, a metal plunger, and anchors.

15 Claims, 6 Drawing Sheets

METHOD FOR MAKING A MICROMACHINED MICROWAVE SIGNAL CONTROL DEVICE

CROSS-REFERENCE TO RELATED APPLICATIONS

This application is a divisional application of U.S. patent application Ser. No. 11/149,400, now issued U.S. Pat. No. 7,420,442, originally filed on Jun. 8, 2005 and entitled "MICROMACHINED MICROWAVE SIGNAL CONTROL DEVICE AND METHOD FOR MAKING SAME" from which benefit of priority is claimed. This application also incorporates by reference U.S. patent application Ser. No. 11/149,404 originally filed Jun. 8, 2005 entitled "WAVEGUIDE DEVICE AND METHOD FOR MAKING SAME" now issued U.S. Pat. No. 7,256,667.

STATEMENT OF GOVERNMENT SUPPORT

This invention was made with Government support under government contract DE-AC04-94AL85000 awarded by the U.S. Department of Energy to Sandia Corporation. The Government has certain rights in the invention, including a paid-up license and the right, in limited circumstances, to require the owner of any patent issuing in this invention to license others on reasonable terms.

FIELD OF THE INVENTION

The present invention relates to monolithic micromachined coplanar devices for controlling transmission of microwave signals, and a method for making the same.

BACKGROUND OF THE INVENTION

Waveguides are critical components for radar and communications systems. Waveguides operate by guiding the propagation of an electromagnetic wave so that the wave is forced to follow a path defined by the physical structure of the guide. Types of waveguides may be divided by the type of energy that is transmitted, including optical, microwave, and radio frequency transmissions. The present invention is concerned with the propagation of microwave energy, or energy in or near the microwave region of the electromagnetic spectrum.

Switches, couplers, splitters, filters, and other components are often used in conjunction with the waveguides to control the signal transmission.

The size of the passive filter typically dominates the volume of commercial transmitting and receiving components. Substantial miniaturization of the transmitting and/or receiving components can be achieved through the reduction in volume of microwave bandpass filters. Although conventional methods could fabricate filters during the fabrication process of transmission lines, such methods utilize large resonant structures as filters.

The U.S. patent application entitled "Waveguide Device and Method for Making Same," (herein incorporated by reference) filed on the same day as the present application discloses a method for making high-aspect ratio waveguide by a manufacturing process known as "LIGA" (an acronym for the German: "Lithographie, Galvanoformung, and Abformung"). Thus, it is desirable to fabricate smaller filters in the waveguide when fabricating the waveguide by a LIGA process.

The manufacture of conventional RF switches is time, labor and capital intensive undertaking. It is also desirable to fabricate RF switches for the waveguide during the LIGA fabrication process of the waveguide.

SUMMARY OF THE INVENTION

In view of the foregoing, it is an object of the present invention to provide filters with high Q and reduced volume in coplanar microwave waveguides. Micromachined quasi-lumped elements are used alone or together as filters embedded inside of a waveguide during the LIGA fabrication process of the waveguide. Furthermore, these so-called quasi-lumped elements are herein taken to mean one or more capacitor, inductor, or serial and/or parallel combination of these elements.

It is another object of the present invention to provide a lateral RF switch with low-loss and high-isolation for coplanar waveguides. According to the present invention, the RF switch comprises a comb drive, a spring, a metal plunger, and anchors. When an actuating voltage is applied to the anchors, the comb drive draws the metal plunger into a gap on the coplanar waveguide to short the lines and shut off the transmission. When the actuating voltage is removed, the spring will return the plunger to its normal position, and the signal transmission starts.

It is a further object of the present invention to provide a method for fabricating a signal controller, e.g., a filter or a switch, for a coplanar waveguide during the LIGA fabrication process of the waveguide. Both patterns for the waveguide and patterns for the signal controllers are created on a mask. Radiation travels through the mask and reaches a photoresist layer on a substrate. The irradiated portions are removed and channels are formed on the substrate. A metal is filled into the channels to form the conductors of the waveguide and the signal controllers.

For the switch, a sacrificial layer is applied in the channels for the movable parts of the switch before filling of the metal, and is removed after filling of the metal. In addition, a gap is formed in the waveguide to allow the plunger to move in and out.

Because the signal controllers can be fabricated during the LIGA fabrication process, they are more cost effective.

BRIEF DESCRIPTION OF THE DRAWINGS

The invention, both as to its organization and manner of operation, may be further understood by reference to the drawings that include FIGS. 1-8, taken in connection with the following descriptions.

DETAILED DESCRIPTION OF EMBODIMENTS OF THE INVENTION

The following description of illustrative, non-limiting embodiments of the invention discloses specific configurations and components. However, the embodiments are merely examples of the present invention: thus, the specific features described below are merely used to describe such embodiments to provide an overall understanding of the present invention. One skilled in the art readily recognizes that the present invention is not limited to the specific embodiments described below. Furthermore, certain descriptions of various configurations and components of the present invention that are known to one skilled in the art are omitted for the sake of clarity and brevity.

An embodiment of the present invention utilizes a LIGA manufacturing process. The main steps of the LIGA process are deep lithography, electroforming, and plastic molding. The LIGA processing has typically been used to create micro-machinery components such as gears or levers for use in microelectromechanical ("MEMS") systems. In contrast, the present invention utilizes the LIGA process to create monolithic integrated signal control devices, e.g., filters and switches, for the waveguide during the LIGA fabrication process of the waveguide. The creation of signal control devices for the waveguide according to an embodiment of the present invention utilizing the LIGA process is described in greater detail below.

Figure 1:
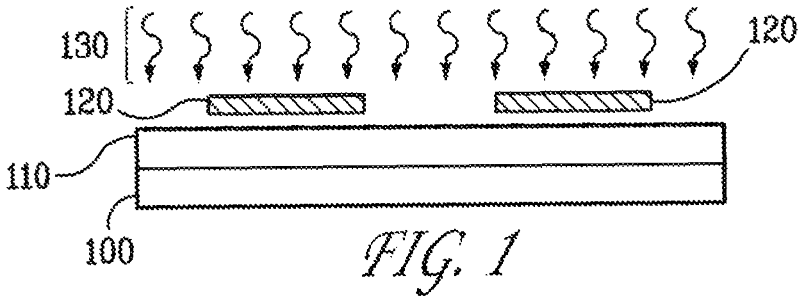
FIG. 1 is a side-view illustration of a portion of a manufacturing process used to create an embodiment of the invention.

Prior to the process depicted in FIG. 1, a mask 120 is created using, for example, an Computer Aided Design ("CAD") program such as AUTOCAD®. While the embodiments of the invention described herein are illustratively created using a gold-plated mask as part of the process, the mask may be chrome or chrome plated, or may be of another material, so long as it is x-ray resistant. Typically, the mask 120 is a singular wafer or disk, but could be created in multiple pieces. The purpose of the mask is to shadow particular portions of the surface 110 to create a pattern thereon. As described below, a mask is used to create a pattern for a waveguide and filters fabricated on the internal surface of the waveguide in one embodiment. It is then used to create a waveguide and a RF switch for controlling signal transmission in the waveguide in another embodiment. In all embodiments the mask 120 includes slots or holes that allow radiation 130 to pass to the surface 110 below the mask 120. The ordinarily skilled artisan readily comprehends that there are various methods of mask creation, including the inventors' use of a CAD program to create a mask. A side view of mask 120 is depicted in FIG. 1.

FIG. 1 illustrates a portion of the manufacturing process used to produce a waveguide and its signal control device according to one embodiment of the present invention. As shown, the mask 120 possesses slots or holes through which radiation 130 is allowed to travel, thereby reaching the surface 110. In the embodiments described herein, x-rays are used as the radiation 130. However, other forms of energy may be used, including laser light, electron or ion beams, or ultraviolet light, as those of ordinary skill in the art readily comprehend.

The x-rays 130, which may be created with a synchrotron, are painted in a predetermined pattern on the surface 110 through the slots in the mask 120. Surface 110 is a photoresist that has previously been applied to substrate 100, and typically is composed of a high molecular weight polymethylmethacrylate ("PMMA") that has been glued or polymerized to the substrate 100. The thickness of the applied PMMA is determined relative to an upper limit of the height of the waveguide of the present invention created through the LIGA process, and is generally on the order of hundreds of microns or up to two or three millimeters in depth. The type of photoresist used as the surface 110 depends upon the type of irradiation utilized to paint the surface 110 with the desired pattern. For instance, while PMMA works well with x-rays, other resists could be utilized for photolithographic UV painting, such as SU-8.

The substrate 100 may be a metallized or metallic substrate. For instance, the substrate 100 may be a metallized silicon wafer of about 2 mm in thickness, or the substrate 100 may be a metallic plate of about the same thickness. However, the embodiment set forth herein utilizes a quartz substrate 100 which has been metallized with a titanium/copper/titanium layer (a waveguide of the present invention including copper on a Ti/Cu/Ti-covered quartz substrate achieved a measured attenuation of 0.064 dB/cm at 15.5 GHz). The ordinarily skilled artisan readily understands that additional metals such as aluminum or copper also could be used for this purpose.

Following irradiation, the device is transferred to a wet bench/developer so that the portions of the surface 110 that have been irradiated may be removed through application of a chemical reactive process. The reactive process may be an acid, solvent, or a base bath. The embodiment described herein utilizes a custom chemical mixture in three tanks, including an initial bath of a solvent mixture of ethylene glycol, butyl ether, morpholine, and ethanolamine, followed by an intermediate rinse which may be of tetramethylammonium hydroxide, potassium hydroxide, alcohol or ionized water, followed by a final rinse of ionized water. The developer and intermediate rinse tanks include a megasonic agitation unit, and all tanks include a filter with a membrane of 0.2 μm or less. The device is dipped into the baths beginning with the developer bath, where the irradiated portion of the surface 110 is allowed to dissolve. The device is then rinsed in the intermediate bath and with a final rinse of ionized water. Notably, since the cross-absorption and scattering rates of the x-rays into the non-irradiated portions of the PMMA is so low there is virtually no undercut as the PMMA is developed, resulting in extremely linear vertices.

The artisan of ordinary skill comprehends that other processes could be used to remove the irradiated portions, including an acid bath or a base bath, or a different solvent bath.

Figure 2:
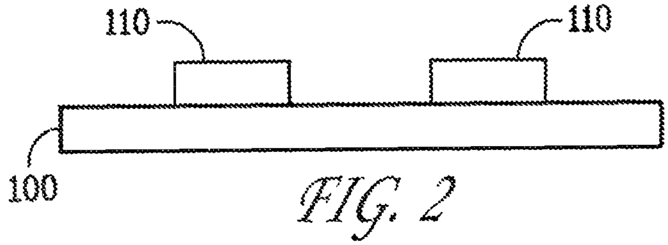
FIG. 2 is a side-view illustration of an additional portion of the manufacturing process.

The device emerging from the developer process is depicted in FIG. 2.

FIG. 2 illustrates a substrate 100 on which the PMMA 110 is shown with channels therein. The channels illustrate the previously irradiated portions of the PMMA 110 that have been removed through chemical reaction and are now capable of being used as a mold to facilitate the application of a metal to the substrate 100. In the embodiment of the invention described herein, copper is applied to the channels, as described below. However, other metals could be used. A non-inclusive list includes silver, gold, nickel, or even alloys such as nickel-cobalt, nickel-iron or bronze.

Figure 3:
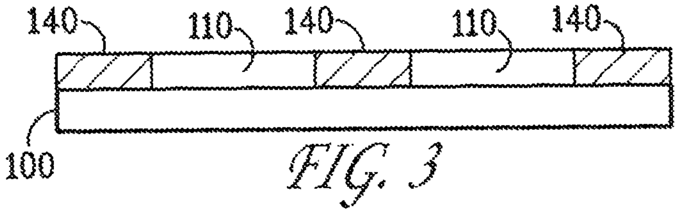
FIG. 3 is a side-view illustration of an additional portion of the manufacturing process.

FIG. 3 illustrates a further step in the manufacturing process of the device of the present invention wherein the channels depicted in FIG. 2 are filled with metal 140 through use of an electroplating (also known as electrodeposition) process. The device is connected to an electrical circuit thereby forming an anode and a cathode, and is then placed in a bath with free-floating copper ions. Electrical current passing through the circuit causes the copper ions to be attracted to the device. Over time, the channels in the surface 110 are filled with an even layer of copper 140.

The ordinarily skilled artisan comprehends that a non-electrical deposition process could also be utilized, such as an electrochemical mechanical deposition or an electroless plating deposition using a chemical process. For instance, a chemical vapor deposition (also known as "CVD") process could be employed utilizing copper (II) hexafluoroacetylacetonate ($Cu(HFA)_2$). The $Cu(HFA)_2$ could be mixed with pure hydrogen or a hydrogen/argon mixture (typically in a 1:3 balance) in a cold wall type vertical flow deposition reactor as a function of measured total pressure (typically with a pressure of 2-10 Torr) with a deposition temperature of about 310-390° C., and an inlet precursor mole fraction of about 0.008-0.09. Temperatures of about 310-360° C. result in selective copper deposition under the above conditions.

Once the channels are filled with copper vertices 140, the device is planarized to remove the remaining PMMA. Alternatively, the PMMA may be removed using an acid, solvent or base bath or other mechanical and/or chemical process wherein the remaining PMMA is reactively or abrasively removed.

Figure 4:
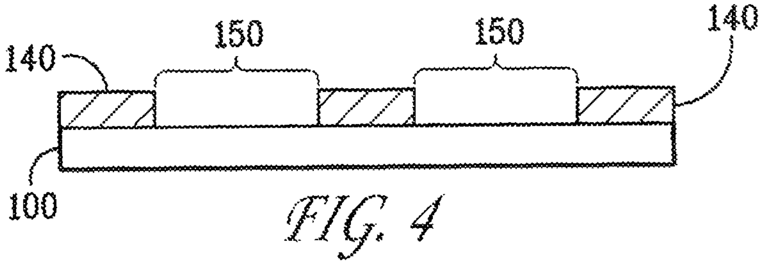
FIG. 4 is a side-view illustration of an additional portion of the manufacturing process.

FIG. 4 illustrates the device with all of the PMMA removed. Copper vertices 140 surround channel(s) 150. Channel(s) 150 constitute the hollow portion of the waveguide upon addition of a capping layer (as discussed herein). As disclosed below, signal control devices, such as filters and switches, can be fabricated in or out of the waveguide to control the signal transmitted in the waveguide. The copper vertices 140 possess surface finishes of optical-quality smoothness and are substantially perfectly vertical, as resulting from the extremely low cross-absorption and scattering rates of the x-rays into the non-irradiated portions of the PMMA. When x-rays and PMMA are utilized, the channel(s) 150 may have an approximate aspect ratio as high as 0.2/3000, wherein the channel 150 may be much less than a micron in width (or approximately as small as 0.2 μm) while having a height of many hundreds of microns (for example, 3 mm). When ultraviolet light and SU-8 are employed, the channel(s) 150 may have an approximate aspect ratio as large as 0.2/1000.

Figure 5:
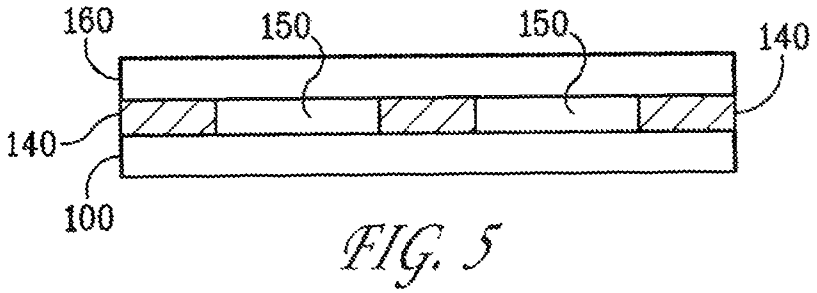
FIG. 5 is a side-view illustration of an embodiment of the present invention including a fully formed waveguide.

FIG. 5 illustrates an embodiment of the present invention wherein a cap layer has been added to cover the waveguide, thereby creating rectangular propagating portions 150 between copper vertices 140, lower layer 100, and upper layer 160. Upper layer 160 may be metallic or metallized, and may be glued or brazed to connect to the copper vertices 140.

Figures 6A, 6B, 6C:
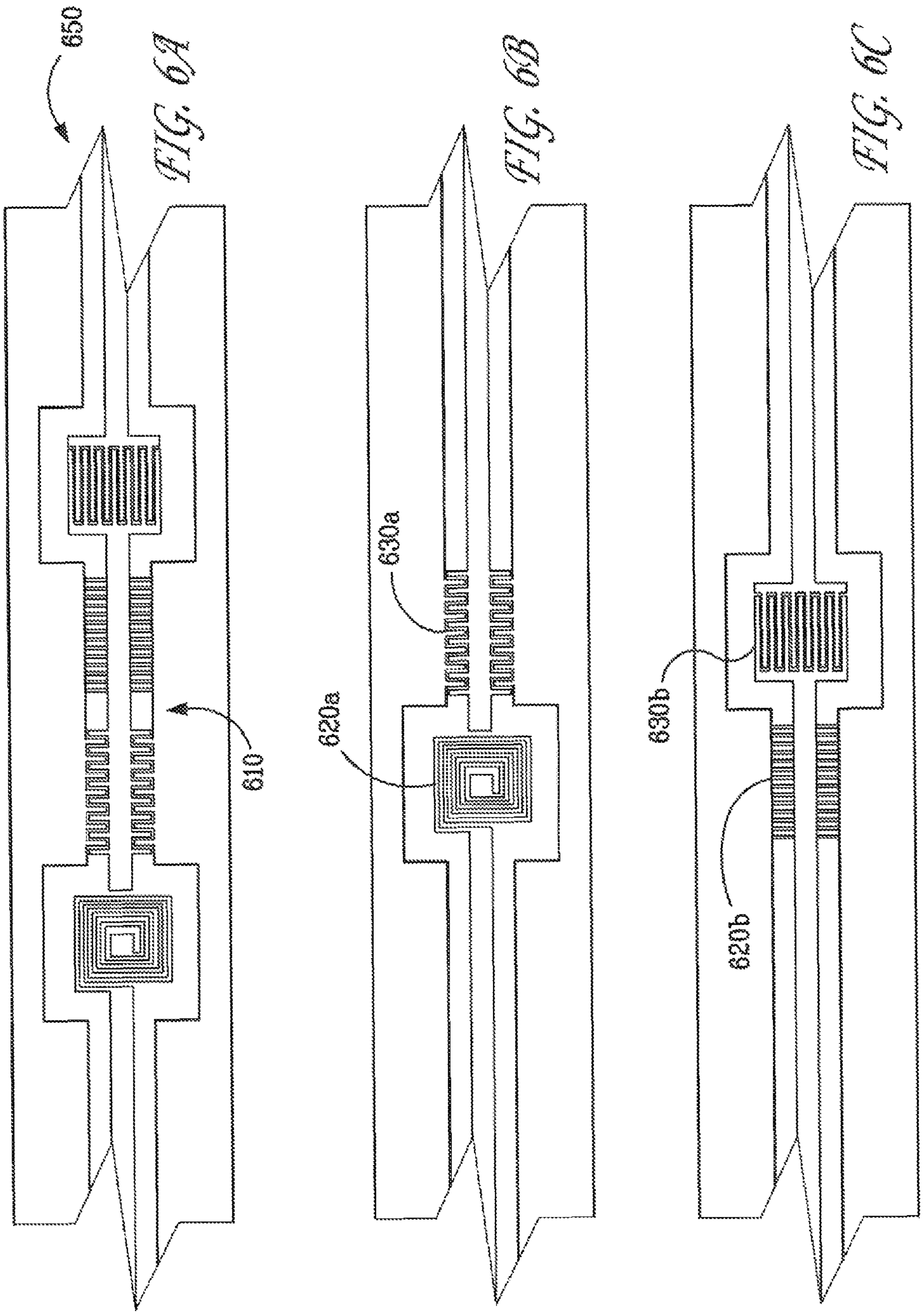
FIGS. 6A, 6B and 6C show quasi-lumped elements fabricated in a waveguide according to one embodiment of the present invention.

FIG. 6A is a top view of a further embodiment of the invention including a filter 610 constituted by quasi-lumped elements and located within propagating channel(s) 650. Quasi-lumped elements are electrically small discontinuities implemented with uniplanar transmission lines. Uniplanar refers to a topology where devices exist only on a single plane. Examples include microstrip transmission lines and coplanar waveguides.

Uniplanar fabrication techniques are desirable over multi-layer or three-dimensional designs due to their ease of fabrication and low cost. Quasi-lumped series and/or parallel capacitors and inductors are implemented as interdigitated microstrip discontinuities and as meandering lines. FIGS. 6A through 6C show various combinations of quasi-lumped capacitors and quasi-lumped inductors. In particular FIG. 6B shows series inductor 620*a* comprising a meandering line coupled to parallel capacitor 630*a* comprising a plurality of interdigitated microstrips while FIG. 6C shows parallel inductor 620*b* comprising a plurality of parallel microstrips coupled to series capacitor 630*b* which comprises a plurality of interdigitated microstrips.

The quasi-lumped series capacitors and inductors are fabricated simultaneously with the copper vertices 140 of the waveguide by the LIGA process described above. Specifically, on the mask 120, in addition to positions corresponding to the copper vertices 140 for the waveguide, positions corresponding to conductors of the capacitors and inductors are also slots and holes so as to allow the radiation 130 to travel through the mask 120 and reach the surface 110 during radiation.

The portions of the surface 110 that have been irradiated are removed through the chemical reactive process, and metal, such as copper, is applied to the channels on the substrate 100 and forms an even layer 140. Finally, an upper layer 160 is added.

High-aspect ratio waveguides provide significantly higher inter-conductor capacitances than the traditional thin-film microstrip lines. It is this enhanced inter-conductor capacitance that provides the mechanism for creating high-Q filters, which would be otherwise unrealizable with standard fabrication techniques.

Figure 7:
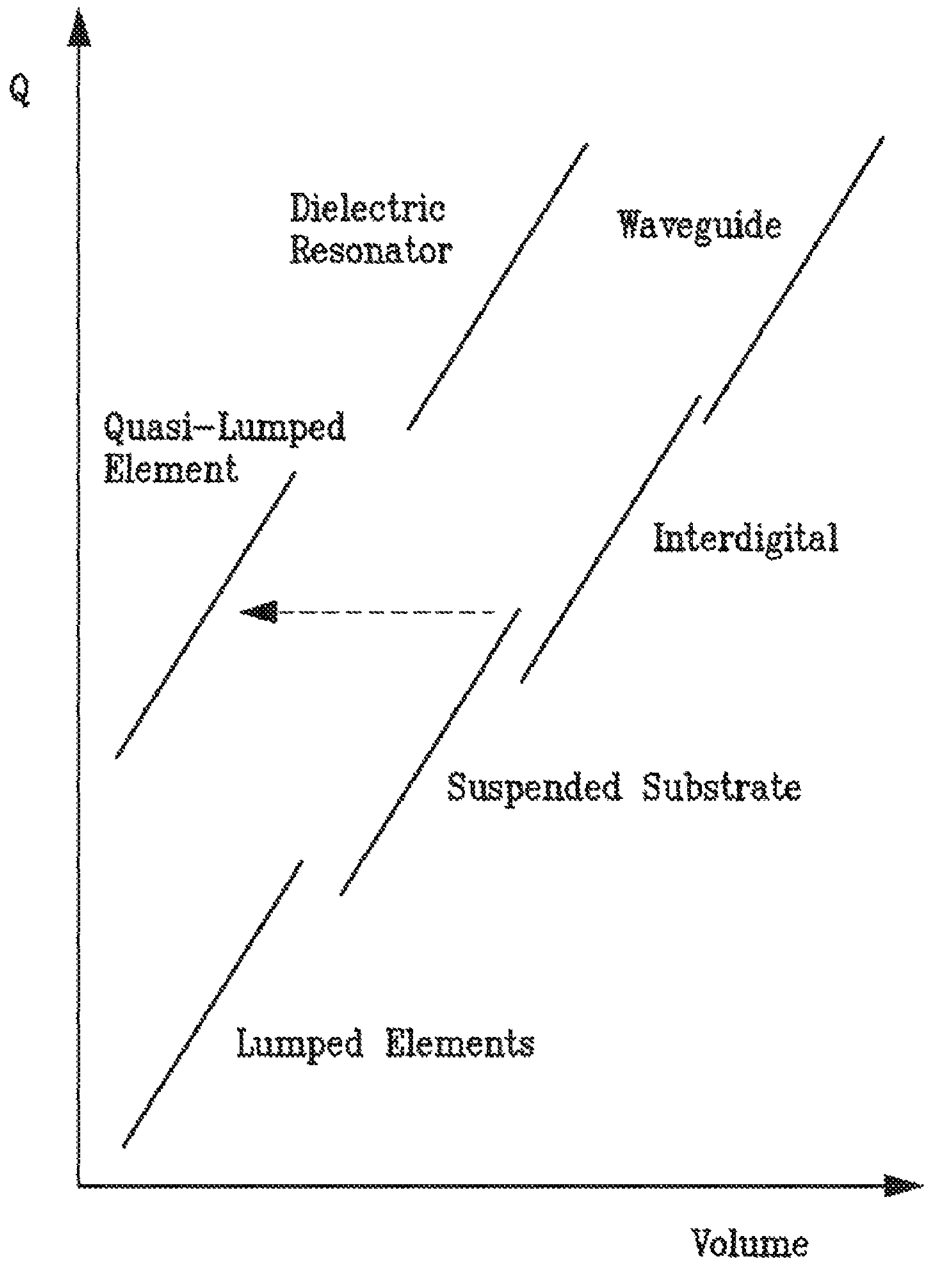
FIG. 7 illustrates the Q factor of filters of the present invention.

The high-aspect ratio waveguide and the high-Q filters in the waveguide are fabricated using the LIGA process, as described above. The LIGA process enables the creation of a waveguide with aspect ratios of or better than 7:1 and conductor sidewall slopes greater than 89.9°. These high-aspect ratio waveguides provide the required inter-conductor capacitances necessary to create quasi-lumped elements of high-Q filters. As shown in FIG. 7, these quasi-lumped elements fabricated on high-permittivity dielectric can provide quality factors similar to those of combline and interdigitated filters but in a smaller volume.

The high-aspect ratio waveguides created with the LIGA fabrication process are of a well-defined, predictable geometry, which allows accurate 3-D numerical modeling. As a result of the characteristics of LIGA-fabricated coupled-line geometries, new filters have unprecedented minimal insertion-loss, transition bandwidths, and in turn, smaller fractional bandwidths.

There are three key parameters for dielectric materials in filter applications: the dielectric constant $\epsilon_r$, the quality factor Q, and the temperature coefficient of the resonant frequency $\tau_{rf}$. Larger dielectric constants $\epsilon_r$ concentrate the electric field and reduce the physical size of the filter. Low-loss dielectrics provide higher quality factors Q resulting in lower insertion loss and steeper filter roll offs. A $\tau_{rf}$ close to zero is required for stability against temperature changes.

To further reduce the size of the quasi-lumped elements and increase the Q of the filter, in one embodiment a high-permittivity, low-loss ceramic dielectric is used as the substrate.

In another embodiment, the substrate of the filters is alumina, a very pure dielectric with one stable phase, a high relative permittivity ($\epsilon_r$=10), a very low intrinsic dielectric loss (I/Q=0.001), and an acceptable temperature coefficient ($\tau_{rf}$=−60 ppm/K).

In another embodiment, the finite-width conductor-backed coplanar waveguide ("CPW") transmission lines and filters are fabricated on a 1 mm thick, 95 mm diameter quartz wafer.

While the reduction of substrate loss does contribute to the realization of high-Q filters, the dominant source of loss in CPW transmission lines is the conductor loss, which is due to high current densities at conductor edges. By increasing the thickness of the conductor, current densities and ohmic losses drop. Simulations show a significant reduction in conductor loss from −15.28 dB/m for 9 μm CPW to −3.95 dB/m for 500 μm CPW at 20 GHz.

In one embodiment, electrically thick copper is used to form low-loss quasi-lumped elements and transmission lines.

Different combinations of fabrication materials can be used for the waveguide and the filters of the present invention, such as nickel on silicon, and copper on quartz.

Simulations show that the electrically thick, micromachined coplanar waveguide possesses decreased dielectric loss, significantly reduced conductor loss, and propagation characteristics conducive to the creation of high-Q filters. The uniplanar filter fabricated in a high-aspect ratio waveguide using the LIGA fabrication process provides miniaturized components for microwave telemetry transmitters and receivers.

Figure 8A:
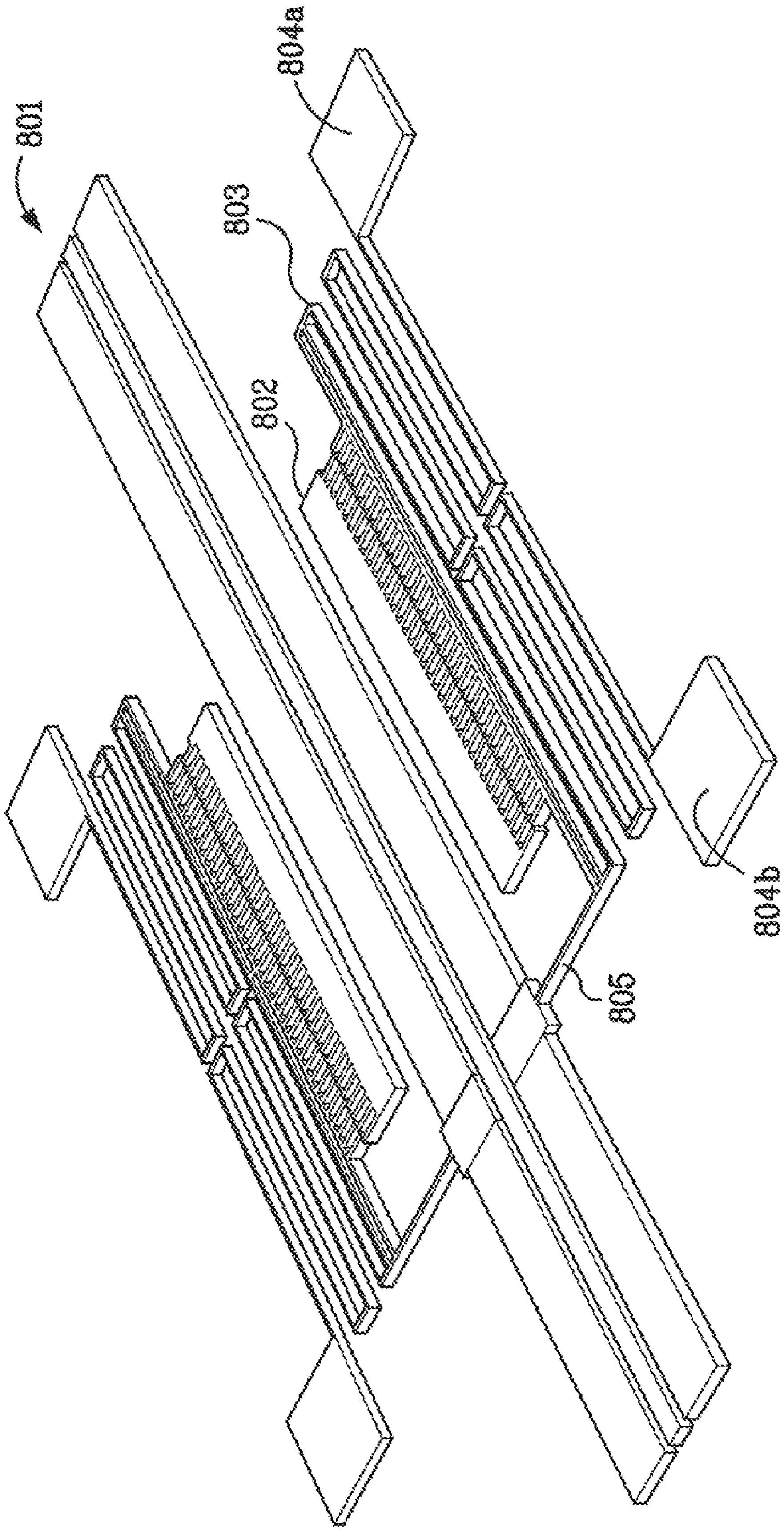
FIG. 8A shows a waveguide and its RF switch according to one embodiment of the present invention, with the switch in the open position.
Figure 8B:
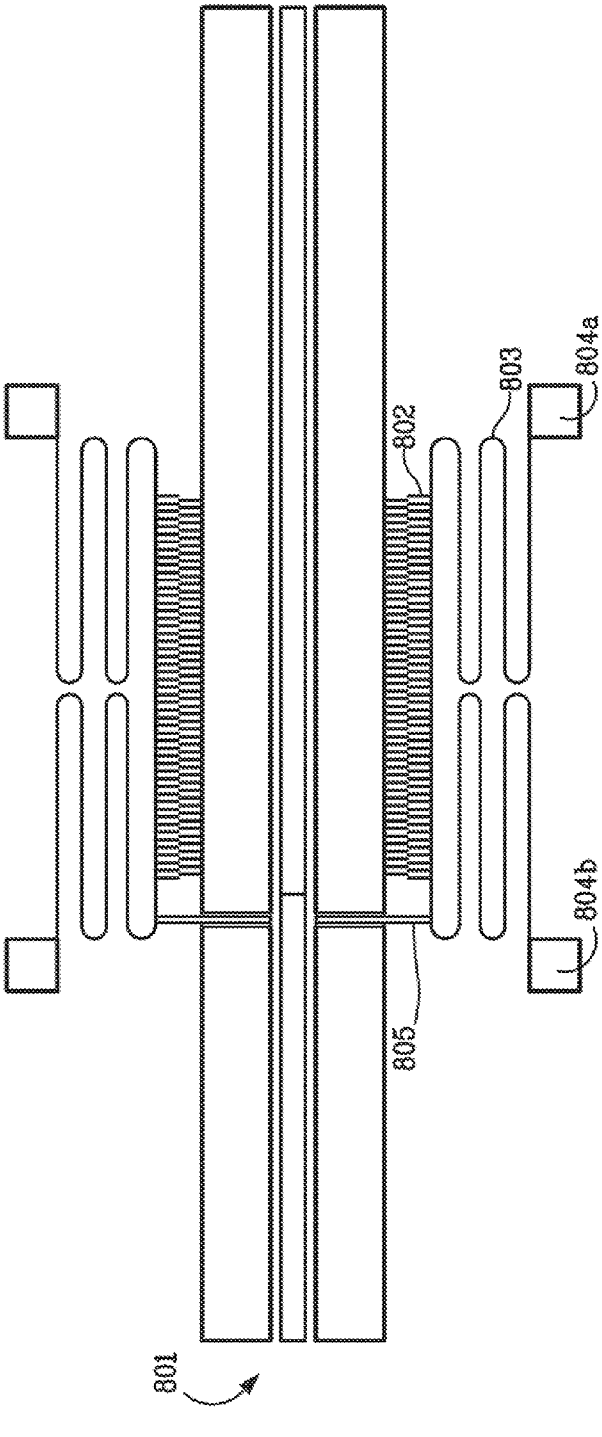
FIG. 8B shows a waveguide and its RF switch according to the embodiment FIG. 8A, with the switch in the closed position.

FIG. 8A shows a microwave waveguide and its RF switch fabricated by a LIGA process according to one embodiment of the present invention. The switch is used to control signal transmission in CPW (hereinafter "waveguide") 801, and includes a comb drive 802, a spring 803, a metal plunger 805, and anchors 804*a*, and 804*b*. When an actuating voltage is applied to the anchors 804*a* and 804*b*, the comb drive 802 draws the metal plunger 805 into a gap on the waveguide 801 to short the lines and shut off transmission, as shown in FIG. 8B. When the actuating voltage is removed, the spring 803 will return the plunger 805 to its normal position, and signal transmission starts.

In one embodiment, in its normal position, the tip of the metal plunger 805 is in the same plane as the first internal vertical surface of the waveguide, so that there is no interference to signal transmission in the waveguide. When the actuating voltage is applied, the tip of the metal plunger 805 is moved to touch the other internal vertical surface of the waveguide to stop signal transmission in the waveguide, as shown in FIG. 8A. The position of the tip is controlled by the comb drive 802 and the spring 803.

The switch is fabricated simultaneously with the waveguide 801 via an x-ray, or UV, LIGA process, modified to include a sacrificial layer for releasing the moving parts. Specifically, on the mask 120, in addition to positions corresponding to the copper vertices 140 for the waveguide, positions corresponding to parts of the switch, i.e., the comb drive 802, the spring 803, anchors 804*a,* and 804*b*, and the plunger 805, are also slots and holes, so as to allow the radiation 130 to travel through the mask 120 and reach the surface 110 during radiation. At the same time, the slot for one of the vertices of the waveguide is cut off to leave a gap in the waveguide 801. In one embodiment on the mask, the solid portion for the gap in the waveguide 801 is on the extension line of the opening for the plunger 805, and has a width that allows the plunger to move in and out, but does not cause significant transmission loss.

Then, the portions of the surface 110 that have been irradiated are removed through a chemical reactive process. A sacrificial layer is applied to internal surface of the channels created on the substrate in which the moving parts—the comb drive 802, the spring 803, and the plunger 805—are going to be formed.

Metal, such as copper, is applied to channels on the substrate 100, those with the sacrificial layer and those without, and forms an even layer 140. Finally, the sacrificial layer is removed to release the moving parts, and an upper layer 160 is added on the waveguide. Sacrificial layers can be fabricated from photoresist, oxide, or metal and selectively removed with appropriate etchants or a timed release for thin structures.

In one embodiment, the switch is fabricated from 50 μm thick, electroplated copper or nickel. To reduce the size of the comb drive 802, a small spring constant, and thus thin lines, are required for the return spring 803. A spring and comb drive fabricated with 5 μm lines will have a circuit area of approximately 2 $mm^2$.

Figure 9A:
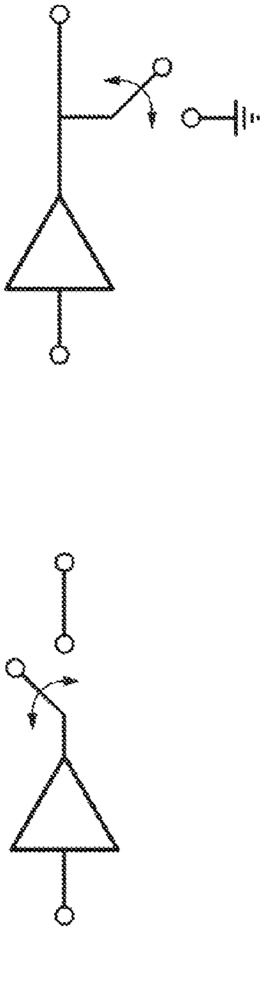
FIGS. 9A and 9B show two embodiments of the RF switch of the present invention.
Figure 9B:
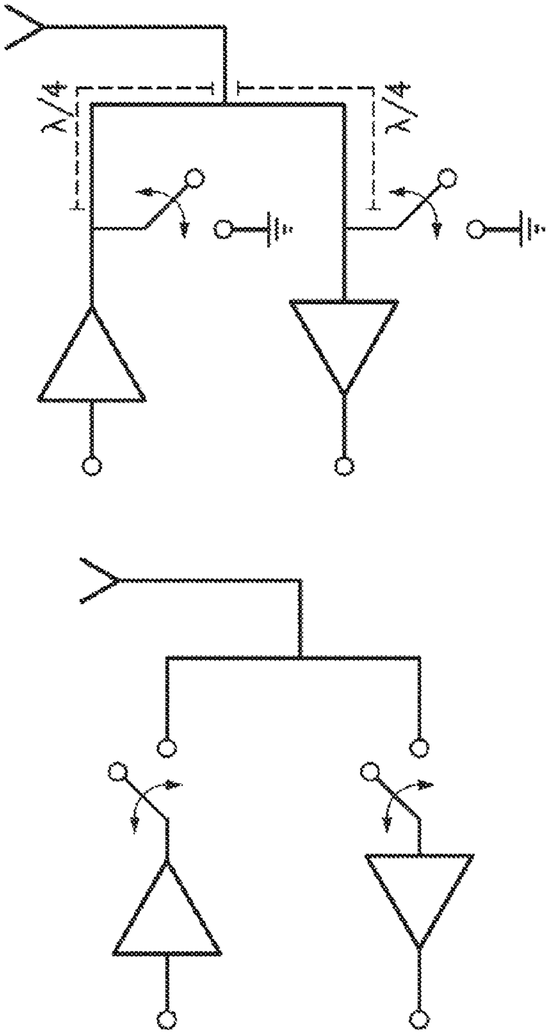

FIGS. 9A and 9B show several embodiments of the RF switch of the present invention.

Single-pole single-throw ("SPST") capacitive or DC-contact shunt switches are ideal for time-domain multiplexed systems ("TDM"), where the transmit power is shut off during the receiving operation. This standard is adapted in many wireless communications systems and virtually all pulsed radars operate in this mode. When the transmitting amplifier is active, the switch is in the lowest energy state and does not interfere with transmission. When the transmitting amplifier is shut off, the switch is activated and provides very high isolation with excellent reliability.

FIG. 9B shows examples of single-pole double-throw ("SPDT") switches for time-domain multiplexed systems. Conventional thin-film shunt switches are not acceptable for high-power operation. The RF switch of the present application can be placed in series with a high-power source, allowing for compact circuits.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments without the use of inventive faculty. For example, some or all of the features of the different embodiments discussed above may be deleted from the embodiment. Therefore, the present invention is not intended to be limited to the embodiments described herein but is to be accorded the widest scope defined only by the claims below and equivalents thereof.

What is claimed is:

1. A method for making a microwave device with an LIGA process, comprising the steps of:

creating patterns for a waveguide and a signal controller used to control signal transmission in the waveguide on a mask, wherein the signal controller is a filter comprising a quasi-lumped element formed on the dielectric substrate;

irradiating a photoresist layer on a dielectric substrate through the mask;

removing irradiated portions of the photoresist layer to form channels on the substrate; and filling the channels with a metal to form conductors of the waveguide and the signal controller.

2. The method according to claim 1, wherein the substrate is made of a material selected from the group consisting of quartz, ceramic, silicon and alumina.

3. The method according to claim 1, wherein the metal is selected from the group consisting of copper, nickel, silver, gold, bronze, and nickel alloy.

4. The method according to claim 1, wherein the quasi-lumped element comprises at least one capacitor, at least one inductor, or a combination of one or more capacitors and one or more inductors formed on the dielectric substrate.

5. The device according to claim 4, wherein the combination of one or more capacitors and one or more inductors comprises at least one capacitor serially coupled to at least one inductor.

6. The device according to claim 4, wherein the combination of one or more capacitors and one or more inductors comprises at least one capacitor coupled in parallel to at least one inductor.

7. The method according to claim 4, wherein the quasi-lumped element comprises a plurality of interdigitated microstrip discontinuities.

8. The method according to claim 4, wherein the quasi-lumped element comprises a meandering line.

9. The method according to claim 1, wherein the signal controller is an RF switch for the waveguide.

10. The method according to claim 9, wherein patterns for the RF switch comprise:

patterns for at least two anchors;

patterns for a metal plunger;

patterns for a driver for moving the metal plunger in a first direction when an actuating voltage is applied to the anchors; and patterns for a spring for moving the metal plunger in a second direction when the actuating voltage is removed.

11. The method according to claim 10, further comprising forming a gap on one vertex of the waveguide to enable the metal plunger to move in to shut off signal transmission in the waveguide and move out to enable the signal transmission in the waveguide.

12. The method according to claim 10, further comprising applying a sacrificial layer in the channels for the plunger, the driver, and the spring before filling the channels with the metal.

13. The method according to claim 12, further comprising removing the sacrificial layer after filling the channels with the metal.

14. The method according to claim 12, wherein the sacrificial layer is made of a material selected from the group consisting of photoresist, oxide, or metal.

15. The method according to claim 10, wherein the driver is a comb drive.

* * * * *